United States Patent [19]

Metz et al.

[11] Patent Number: 4,739,283
[45] Date of Patent: Apr. 19, 1988

[54] VARIABLE TRANSIENT RESPONSE CONTROL FOR LINEAR INTEGRATED-CIRCUIT HIGH-FREQUENCY AMPLIFIERS

[75] Inventors: Arthur J. Metz, Gervais; James S. Lamb, Portland, both of Oreg.

[73] Assignee: Tektronix, Inc., Beaverton, Oreg.

[21] Appl. No.: 20,270

[22] Filed: Mar. 2, 1987

[51] Int. Cl.[4] .............................................. H03G 3/18
[52] U.S. Cl. .................................................... 330/284
[58] Field of Search ............... 330/252, 254, 278, 279, 330/284

[56] References Cited

FOREIGN PATENT DOCUMENTS 0147310 9/1982 Japan ................................. 330/284
0203306 12/1982 Japan ................................. 330/284

Primary Examiner—Gene Wan
Attorney, Agent, or Firm—George T. Noe

[57] ABSTRACT

A variable transient response control for linear integrated-circuit high-frequency amplifiers comprises a variable equivalent resistive damping network interposed in the signal transmission path, and an electronic control circuit therefor. The resistive network includes preferably Schottky diodes having low inductance and a determinable equivalent resistance in the forward conducting condition.

4 Claims, 1 Drawing Sheet

VARIABLE TRANSIENT RESPONSE CONTROL FOR LINEAR INTEGRATED-CIRCUIT HIGH-FREQUENCY AMPLIFIERS

BACKGROUND OF THE INVENTION

It is common in high-frequency amplifiers to provide some means by which transient response may be varied in order to adjust the circuit for optimum performance. Typically, transient response adjustments (also known as high-frequency compensation or signal peaking) are made by varying the values of reactive passive elements, such as capacitors or inductors in the signal path.

In other instances, recognizing that damping the factor (k) is associated with the quality factor (Q) of a resonant circuit and is thus related to the transient response, the damping factor may be adjusted by varying resistances as well as capacitances and inductances to provide a critically damped case wherein a step voltage rises to its final steady-state value without overshoot (underdamped case) or dribble-up (overdamped case).

In integrated circuits, implementation of transient response control is difficult because reactive components (or the tools used to adjust them) often introduce parasitic reactances into the circuit which compromise performance. Also, sensitive circuit nodes which need adjusting are often inaccessible, requiring additional off-chip compensation circuitry.

SUMMARY OF THE INVENTION

In accordance with the present invention, a variable transient response control for a linear integrated circuit high-frequency amplifier comprises a varible resistive damping network and an electronic control circuit therefor. The variable resistive damping network is inserted with a minimum of additional loading into the signal path at the point where the amplifier is most sensitive to damping.

It is therefore one object of the present invention to provide a transient response control for a linear integrated circuit high-frequency amplifier which can be inserted directly into the signal path with a minimum of loading, and which can be controlled externally without introducing parasitic reactances.

It is another object of the present invention to electronically adjust the damping factor of a high-frequency amplifier to provide optimum step response.

Other objects, features, and advantages of the present invention will become apparent to those having skill in the art upon a reading of the following detailed description when taken in conjunction with the accompanying drawings.

DETAILED DESCRIPTION OF THE INVENTION

Figure 1:
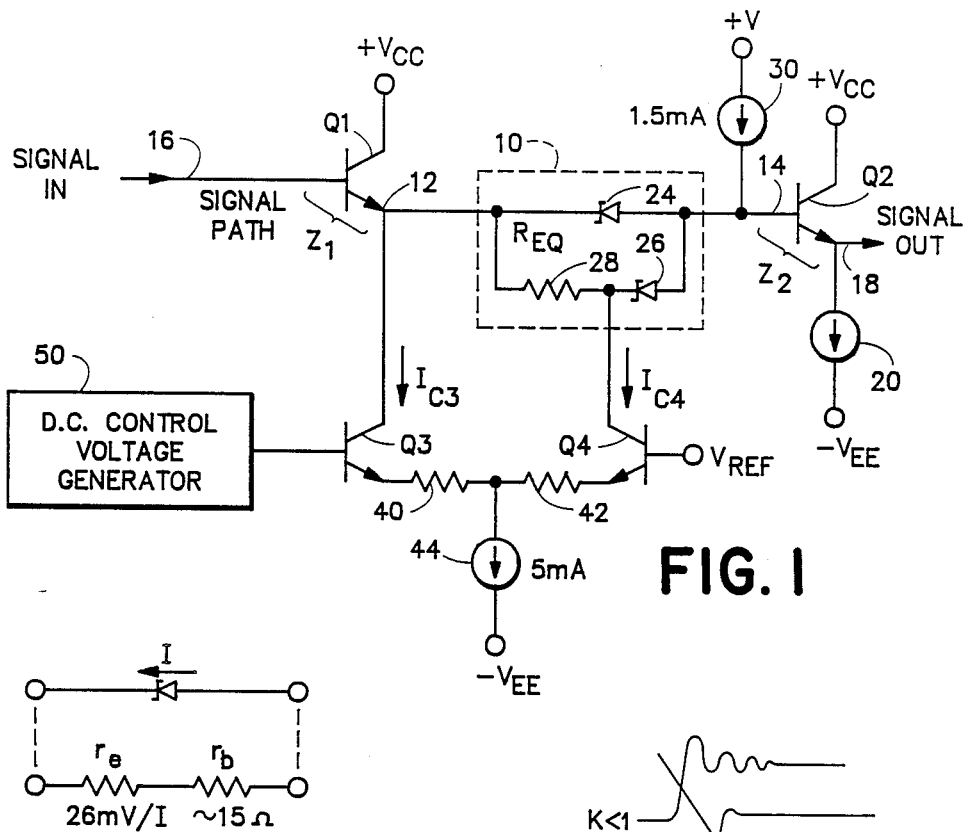
FIG. 1 is a schematic diagram of a high-frequency signal path having an adjustable damping resistive network in accordance with the present invention.

Referring to FIG. 1 of the drawings, there is shown a variable resistive network 10 interposed between a first circuit node 12 and a second circuit node 14 in a high-frequency signal transmission path which, for this discussion, includes a pair of emitter-follower transistors Q1 and Q2 connected between an input path 16 and an output path 18. A current source 20 provides operating current for emitter-follower transistor Q2, while operating current for transistor Q1 is supplied via current-steering transistor Q3, which will be discussed below. Transistors Q1 and Q2 represent a portion of a linear integrated-circuit high frequency amplifier, and the variable resistive network 10 is used in this instance to damp the inductive output impedance Z1 of transistor Q1 which drives the capacitive input impedance Z2 of transistor Q2.

Figure 2:
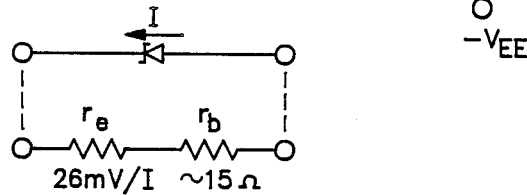
FIG. 2 depicts the equivalent resistance of a forward-conducting Schottky diode.

Variable resistive network 10 comprises a first Schottky diode 24 connected in parallel with the serial combination of a second Schottky diode 26 and a resistor 28. When Schottky diodes 24 and 26 are forward biased, and therefore conducting, they exhibit very low inductance which can thus be regarded as a negligible factor, and they each have an equivalent resistance of $r_e + r_b$. Refer to FIG. 2. Bipolar diodes could be used in some situations; however, their inherent high inductance would have to be taken into account. Current for conduction of these diodes is provided by current source 30.

Figure 3:
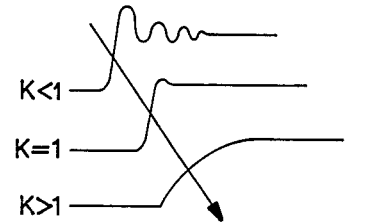
FIG. 3 shows the increased damping of a step signal as damping resistance is increased.

Control of the variable resistive network 10 is provided by exploiting the unidirectional conducting properties of diodes 24 and 26 in shifting current from current source 30 between the diodes in a controlled fashion, thereby changing the equivalent resistance $R_{EQ}$ of the network 10. The collector of a transistor Q3 is connected to node 12, and the collector of a transistor Q4 is connected to the junction of resistor 28 and diode 26. The emitters of transistors Q3 and Q4 are coupled together through respective emitter resistors 40 and 42 and returned to a suitable voltage supply $-V_{EE}$ through a current generator 44. The base of transistor Q3 is connected to a variable D.C. control voltage generator 50, while the base of transistor Q4 is connected to a fixed reference voltage $V_{REF}$. Voltage generator 50 may be physically located outside the integrated circuit, and may comprise any of a number of known variable or programmable voltage sources. The relevance is that with a single control voltage, transistors Q3 and Q4 perform a current-steering function to vary the equivalent resistance $R_{EQ}$ of variable resistive network 10 to change the damping factor (k) of the signal transmission path. The damping factor (k) is a function equivalent resistance $R_{EQ}$, output impedance Z1 of transistor Q1, and input impedance Z2 of transistor Q2. FIG. 3 shows the effect of increasing the value of $R_{EQ}$, changing the damping factor from an underdamped case (k<1) to a critically damped case (k=1) and then to an overdamped case (k>1). When critically damped, step response of the amplifier is optimum.

Assigning some numerical values to understand circuit operation, assume that current generator 30 provides 1.5 milliamperes (mA), current generator 44 sinks 5.0 mA, and the value of resistor 28 is 100 ohms.

Assume a first condition in which votage generator 50 causes transistor Q3 to conduct and transistor Q4 to be turned off, so that $I_{C3} = 5.0$ mA and $I_{C4} = 0$ mA. In this first condition, all of the current from current source 30 flows through diode 24 (and hence none flows through diode 26). The value of $R_{EQ}$, then, is simply the equivalent resistance of diode 24, and can be calculated to be about 32 ohms.

Now assume a second condition in which voltage generator 50 causes transistor Q4 to conduct and transistor Q3 to be turned off, so that $I_{C3}=0$ mA and $I_{C4}=5.0$ mA. In this second condition, all of the current from current source 30 flows through diode 26 (and hence none flows through diode 24). The value of $R_{EQ}$, then, is the equivalent resistance of diode 26 plus the resistance of resistor 28, and can be calculated to be about 132 ohms.

Figure 4:
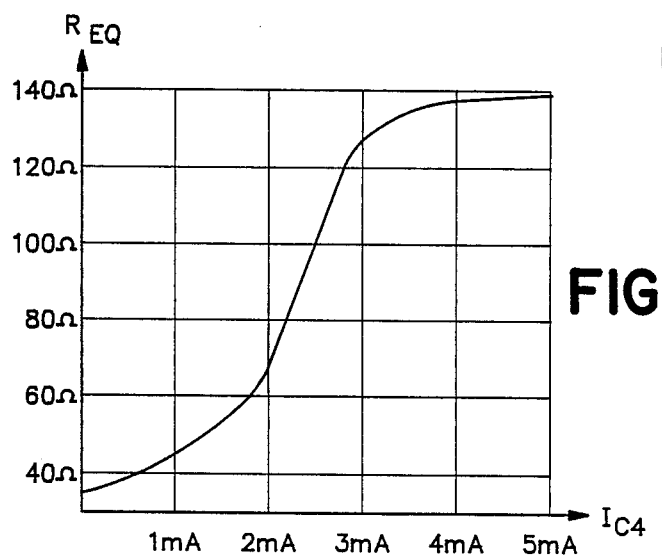
FIG. 4 shows a transfer curve, plotting equivalent resistance versus control current, for the circuit of FIG. 1.

When the control voltage from voltage generator 50 is changed linearly from the first condition described above to the second condition, the equivalent resistance $R_{EQ}$ is a nonlinear function of $I_{C4}$ as current from current source 30 shared between diodes 24 and 26. The transfer curve thus effected is shown in FIG. 4.

Note that in any case, the current through emitter follower transistor Q3 is 5.0 mA−1.5 mA=3.5 mA. Therefore, it can be seen that variable resistive damping network described hereinabove is inserted with a minimum of additional loading directly into the high-frequency path at the point where the amplifier is most sensitive to damping. It can also be seen that while the variable transient response control network of the present invention is inserted between a pair of emitter followers for purposes of discussion, there are many amplifier configurations that can be compensated in a like manner.

While we have shown and described a preferred embodiment of our invention, it will be apparent to those skilled in the art that many changes may be made without departing from our invention in its broader aspects. The appended claims therefore cover all such changes and modifications as fall therewithin.

What we claim as being novel is:

1. A variable transient response control for a high-frequency signal transmission path, comprising:
    a first circuit node and a second circuit node located at predetermined points in said signal transmission path;
    a current generator connected to said second circuit node and providing thereto a predetermined current;
    a variable resistive network comprising a first unidirectional conducting device paralleled by a serial combination of a resistor and a second unidirectional conducting device interposed between said first and second circuit nodes; and
    control circuit means for controllably steering said predetermined current through said first and second unidirectional conducting devices thereby to vary the equivalent resistance thereof.

2. A variable transient response control in accordance with claim 1 wherein said unidirectional conducting devices are diodes.

3. A variable transient response control in accordance with claim 2 wherein said diodes are Schottky barrier diodes.

4. A variable transient response control in accordance with claim 1 wherein said control circuit means comprises a first transistor having a collector connected to said first circuit node, a second transistor having a collector connected to the junction of said resistor and said second unidirectional conducting means, wherein emitters of said first and second transistors are coupled together to a current generator which generates a current at least as great as said predetermined current, and wherein a control voltage generator is coupled to a base of said first transistor and a reference voltage source is coupled to a base of said second transistor.

* * * * *